United States Patent [19]
Kubo et al.

[11] Patent Number: 5,808,934
[45] Date of Patent: Sep. 15, 1998

[54] INTEGRATED LOGIC CIRCUIT AND EEPROM

[75] Inventors: Kazuaki Kubo; Yukio Suzuki; Masanori Miyagi, all of Chiba, Japan

[73] Assignee: Seiko Instruments Inc., Japan

[21] Appl. No.: 504,116

[22] Filed: Jul. 19, 1995

[30] Foreign Application Priority Data

| Aug. 1, 1994 | [JP] | Japan | 6-180247 |
| Sep. 21, 1994 | [JP] | Japan | 6-227061 |
| May 12, 1995 | [JP] | Japan | 7-114896 |

[51] Int. Cl.$^6$ .................................................. G11C 11/34
[52] U.S. Cl. ...................................... 365/182; 365/185.21
[58] Field of Search .............................. 365/185.21, 184, 365/182, 226

[56] References Cited

U.S. PATENT DOCUMENTS

| 4,933,906 | 6/1990 | Terada et al. | 365/185.21 |
| 5,268,870 | 12/1993 | Harari | 365/185.21 |
| 5,483,494 | 1/1996 | Taura | 365/185.21 |

*Primary Examiner*—A. Zarabian
*Attorney, Agent, or Firm*—Adams & Wilks

[57] ABSTRACT

An EEPROM operable at a reduced power source voltage comprises a decoder circuit for decoding input signals, a memory array for storing the decoded, a reading circuit for operating the decoder circuit and the memory array, and for reading out data stored in the memory array, and a writing circuit for operating the decoder circuit and the memory array, and for writing data to the memory array. The EEPROM is divided into a first circuit area comprising a plurality of first transistors driven by a first power source voltage, an absolute value of a threshold voltage of the first transistors in the first circuit area being within the range of approximately 0.3 V to 0.7 V, the first circuit area including at least the reading circuit, and a second circuit area comprising a plurality of second transistors driven by a second power source voltage, an absolute value of a threshold voltage of the second transistors in the second circuit area being within the range of approximately 0.7 V to 0.9 V, the second circuit area including at least the writing circuit.

19 Claims, 16 Drawing Sheets

INTEGRATED LOGIC CIRCUIT AND EEPROM

BACKGROUND OF THE INVENTION

The present invention relates to a semiconductor integrated circuit device which is required to operate at an extremely low source voltage which is a termination voltage of 0.9 V in one battery, particularly in a low source voltage area.

Heretofore, as a MOS circuit which comprises a plurality of MOS transistors, a CMOS inverter circuit shown in FIG. 9 is known with respect to one input gate. (FIG. 10 is a plane pattern view of a conventional circuit).

When a PMOS transistor 91 and an NMOS transistor 92 are respectively operated, a sufficient gate bias $V_G$ for the portion of the source voltage Vcc is applied to provide a favorable switching operation and an ON-current. For this purpose, the threshold voltage Vth of each MOS transistor is set to a value not exceedingly high (absolute value thereof is about 0.9 V or less). In addition, the source voltage needs to be set to a sufficiently higher value (for example, 1.8 V) than this Vth.

On the other hand, to inhibit the OFF-leak current of the MOS transistor which largely affects the stand-by current of the semiconductor chip, the threshold voltage Vth has been set to not too low a value (about 0.7 V or more).

The semiconductor integrated circuit memory device includes a circuit that identifies an ON state and an OFF state of the memory element to output a data 0 value and a data 1. A circuit which converts the ON state and the OFF state of the aforementioned memory element into a data 0 and a data 1 is known as a sense amplifier.

Quite recently, demand has increased for the reduction in the voltage of the semiconductor integrated circuit device. In particular, in the market of portable devices, a demand has been made for operating the device with one battery (0.9 to 1.5 V). Consequently, even the sense amplifier circuit is required to be operated at a low voltage.

FIG. 17 shows a circuit view showing a conventional sense amplifier. To the input of the buffer circuit 106, a precharge circuit 101 and a load circuit 102 are connected in the structure.

Next, an outline of the operation of the circuit will be explained hereinbelow. When the memory element 109 is in the OFF state, current does not flow through the load circuit 102. Thus, the precharge circuit 101 raises the input potential of the buffer circuit 106 to the Vcc level. Consequently, the sense amplifier circuit output 207 will be a data 0 value.

When the memory element 109 is in the ON state, a current flows through the load circuit 102, and the input potential of the buffer circuit 106 is drawn towards GND. Consequently, the sense amplifier circuit output 207 becomes a data 1 value.

FIG. 18 shows the potential of each signal during operation of the circuit. When an enable signal 201 (reference numeral 202 denotes the reversed signal of 201) is set to a Vcc level, the sense amplifier will be enabled. At the same time, the memory element 109 is selected by setting a column decode signal 203, a row decode signal 204, and a written reverse signal 206 is set at the Vcc level. At this time, the control signal 205 of the memory element 109 is set to the potential Vcg (Vcg denotes a potential between the Vcc and GND). When the memory element 109 is in the OFF state, the sense amplifier output 207 becomes data 0. When the memory element 109 is in the ON state, the sense amplifier output 207 becomes data 1.

However, the MOS circuit in the prior art provides a sufficient gate bias at a vcc level (for example, 1.8 V or more) which is sufficiently larger than the threshold voltage vth. Thus, a favorable operation can be performed. However, when the voltage Vcc lowers to approach an extremely low power source voltage area (in the vicinity of 0.9 V), the voltage Vth of the MOS transistor becomes approximately equal to Vcc with the result that the gate bias is weakened and a sufficient switching operation and ON current cannot be obtained which leads to the problem of an increase in the output delay, and a reduction in the output drivability.

In particular, when the threshold voltage Vth increases with the temperature variation or the like to 0.9 V or more, the MOS transistor is not turned on and ceases to function at the voltage Vcc of 0.9 V.

Further, in the conventional sense amplifier circuit, the input potential of the buffer circuit 106 is not reduced to a level of the input reverse voltage due to the reduction in the current driving capacity of the memory element 109 at a voltage Vcc of 3 V or less even when the memory element 109 is in the ON state. Consequently, data cannot be read at a voltage Vcc of 3 V or less.

In this manner, there is a problem in that the prior art sense amplifier cannot be used at an the extremely low power source voltage range.

The object of the present invention is to sufficiently operate a semiconductor integrated circuit at an extremely low source voltage (0.9 V) to solve the above-described conventional problem, and to fabricate a circuit for maintaining the characteristics of the conventional low stand-by current or the like.

SUMMARY OF THE INVENTION

As a first means, the threshold voltage Vth of each of the required MOS transistors is set to a value lower than the conventional value. The value is set so that even when the value of the threshold voltage Vth rises due to a temperature variation or the like, the value never reaches the extremely low power source voltage (0.9 V).

As a second means, in each of the P-type MOS transistor and the N-type MOS transistor, the channel length of the MOS transistor having a lower threshold voltage is made longer than the channel length of the MOS transistor having a higher threshold voltage.

As a third means, only the channel length of the MOS transistor is lengthened which has a lower threshold voltage in a path where an off-leak current is generated which affects the stand-by current.

As fourth means, the semiconductor integrated circuit comprises a first circuit which operates within a first range of power source voltages and a second circuit which operates within a second range of power source voltages where the minimum operating voltage is higher than that in the first range of power source voltages.

As a fifth means, the sense amplifier circuit comprises a differential amplifying circuit having a pair of input terminals, a first precharge circuit and a first load circuit connected to one of the input terminals, and a second precharge circuit and a second load circuit connected to the other one of the input terminals.

As a sixth means, the first and the second precharge circuit in the sense amplifier circuit comprise an N-type MOS transistor.

As a seventh means, the first and the second precharge circuits in the sense amplifier circuit comprise a P-type MOS transistor.

As an eighth means, the differential amplifying circuit in the sense amplifier circuit comprises a P-type MOS transistor and an N-type MOS transistor.

Since the MOS transistor having a threshold voltage Vth lowered by the above described first means has a low threshold voltage Vth even when the power source voltage is 0.9 V, the gate bias is sufficiently applied to obtain a normal switching operation and ON current.

Even when the threshold voltage Vth is lowered with the above-described second means, the off-leak current of the MOS transistor can be largely suppressed by increasing the channel length of the required portion.

Since only the channel length of the required portion lengthened with the above-described third means, an increase in the area can be minimized.

The threshold voltage Vth of the circuit which is required to be set to the conventional value is not required to be lowered, which leads to the reduction in the consumed current. With the fifth to the eighth means, the conventional method of detecting the voltage becomes a method of comparing current with high precision for detecting a slight difference in current. Consequently, a sense amplifier circuit can be realized which can read data of the memory device at low voltages.

DETAILED DESCRIPTION OF THE INVENTION

Figure 1:
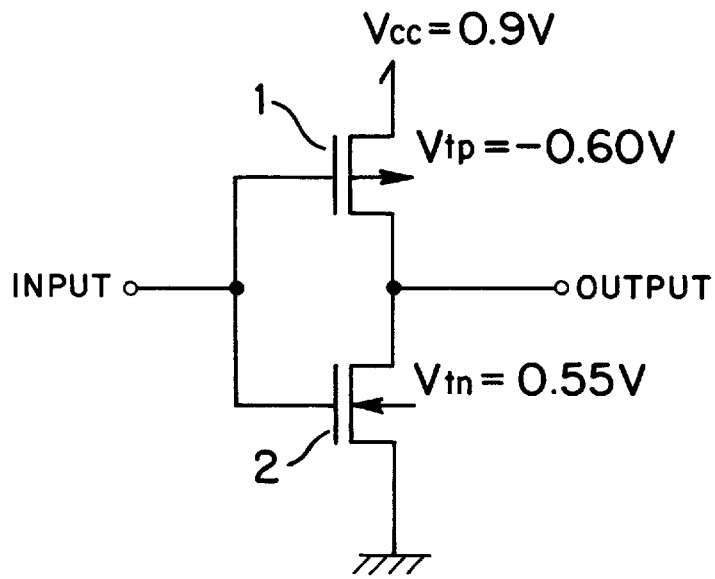
FIG. 1 is a circuit diagram of a CMOS inverter in a semiconductor integrated device according to the present invention.
Figure 2:
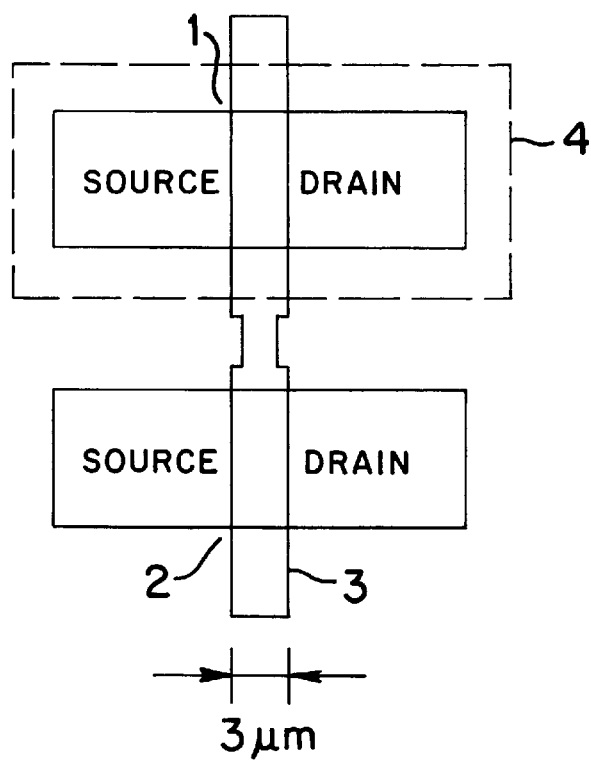
FIG. 2 is a plane pattern view of the CMOS inverter in the semiconductor integrated circuit device according to the present invention.

Embodiments of the present invention will be explained in conjunction with the drawings. FIG. 1 shows a CMOS inverter circuit according to an embodiment of the present invention. FIG. 2 is a plane view pattern of the inverter circuit. The circuit is part of the whole circuit which is present on the semiconductor substrate where there are, among other circuits, a circuit based on the technology of the present invention and a circuit based on the prior art.

Referring to FIGS. 1 and 2, a PMOS transistor 1 and an NMOS transistor are connected in series between a power source and ground to form a CMOS inverter. In addition, the channel length (L length) (conventionally for example, 2 $\mu$m) of the polysilicon gate 3 is made longer than that of the conventional size (for example, it is increased to 3 $\mu$m). The threshold voltages Vth of the PMOS transistor and the NMOS transistor are respectively lower than the conventional value (for example, Vtp=−0.6 V, Vtn=0.55 V). Even when Vcc is 0.9 V, the gate bias is sufficiently transmitted to the gate of each transistor. In other words, 0 V potential is given when the input is in the full swing (0 V through Vcc), the gate bias of the voltage Vcc (0.9 V) which is larger than the threshold voltage Vth (0.6 V in the absolute value) is given with the result that the PMOS transistor is turned firmly on. (The NMOS transistor is turned off.) On the other hand, when the Vcc potential is applied to the input, the PMOS transistor is turned off while the NMOS transistor is turned on.

Figure 3:
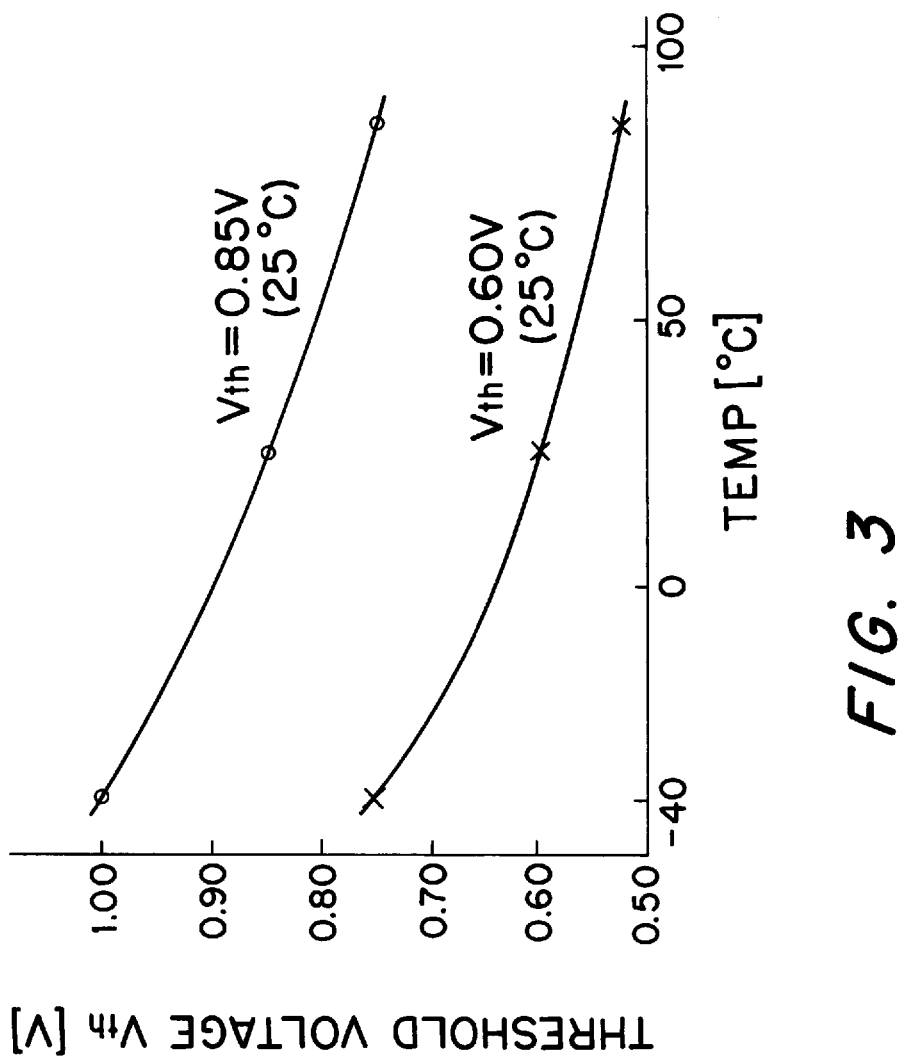
FIG. 3 is a graph showing a relation between a threshold voltage Vth and temperature of a MOS transistor.

Here, FIG. 3 shows the relations between the threshold voltage Vth and the temperature of the PMOS transistor or the NMOS transistor. Even when the threshold voltage Vth rises resulting from such a temperature variation, it is required that the Vth is set to a level of 0.9 V or less.

For example, when the conventional voltage Vth is as high as 0.85 V, the threshold voltage Vth comes close to the value of Vcc with the result that the gate bias is not sufficient and the transistor is not operated. In the meantime, even when the temperature is lowered, by setting the threshold voltage Vth to 0.6 V, the gate bias can be sufficiently applied.

Figure 4:
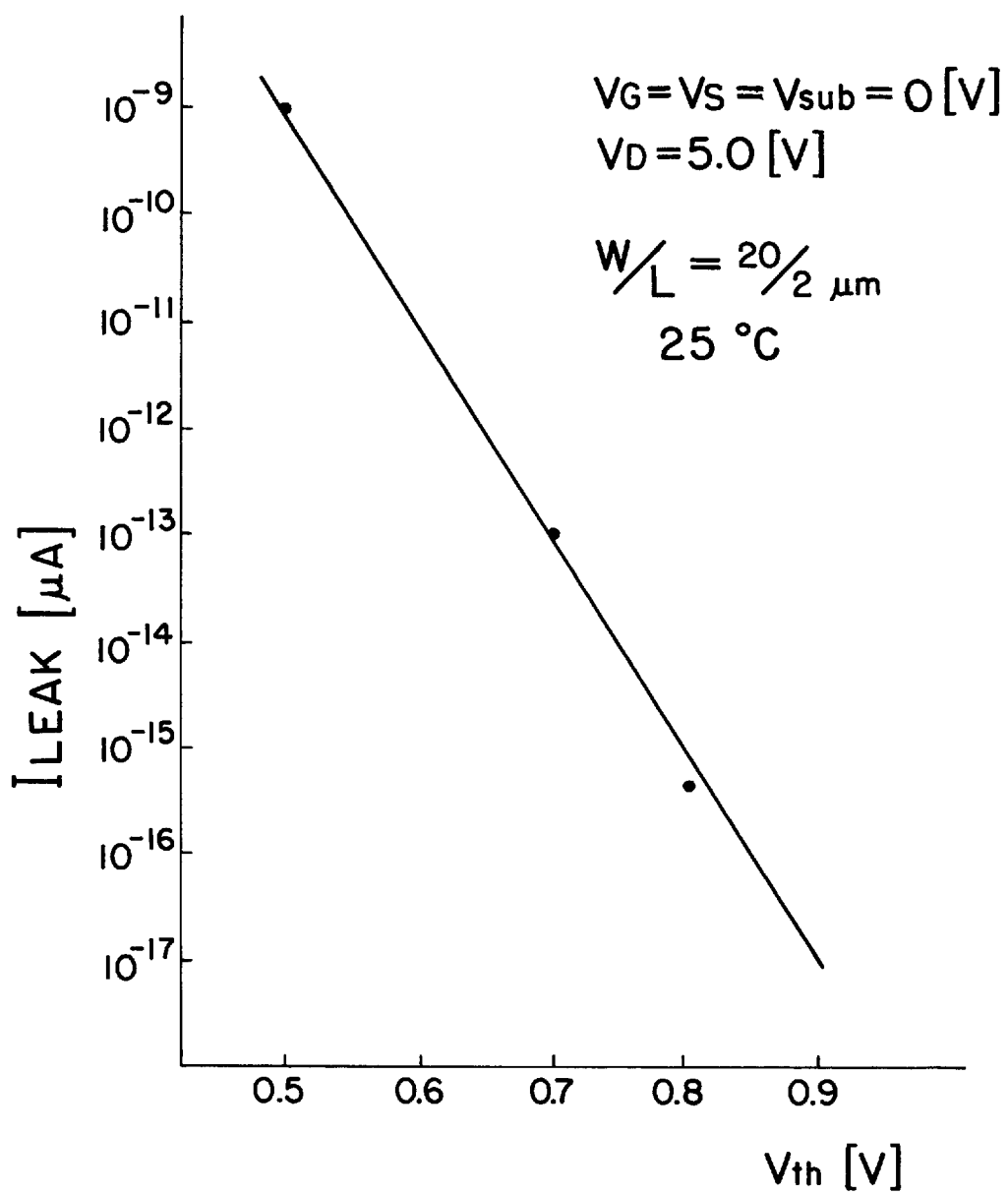
FIG. 4 is a graph showing a relation between an off-leak current and the threshold voltage Vth of a MOS transistor.

Here, an increase in the off-leak current of the MOS transistor by lowering the Vth must be considered. FIG. 4 shows a threshold voltage Vth dependency of the off-leak current of the PMOS transistor. The leak current increases by lowering the threshold voltage Vth. This largely affects the stand-by current of the semiconductor chip and damages the favorable characteristics of the conventional low stand-by current.

Figure 5:
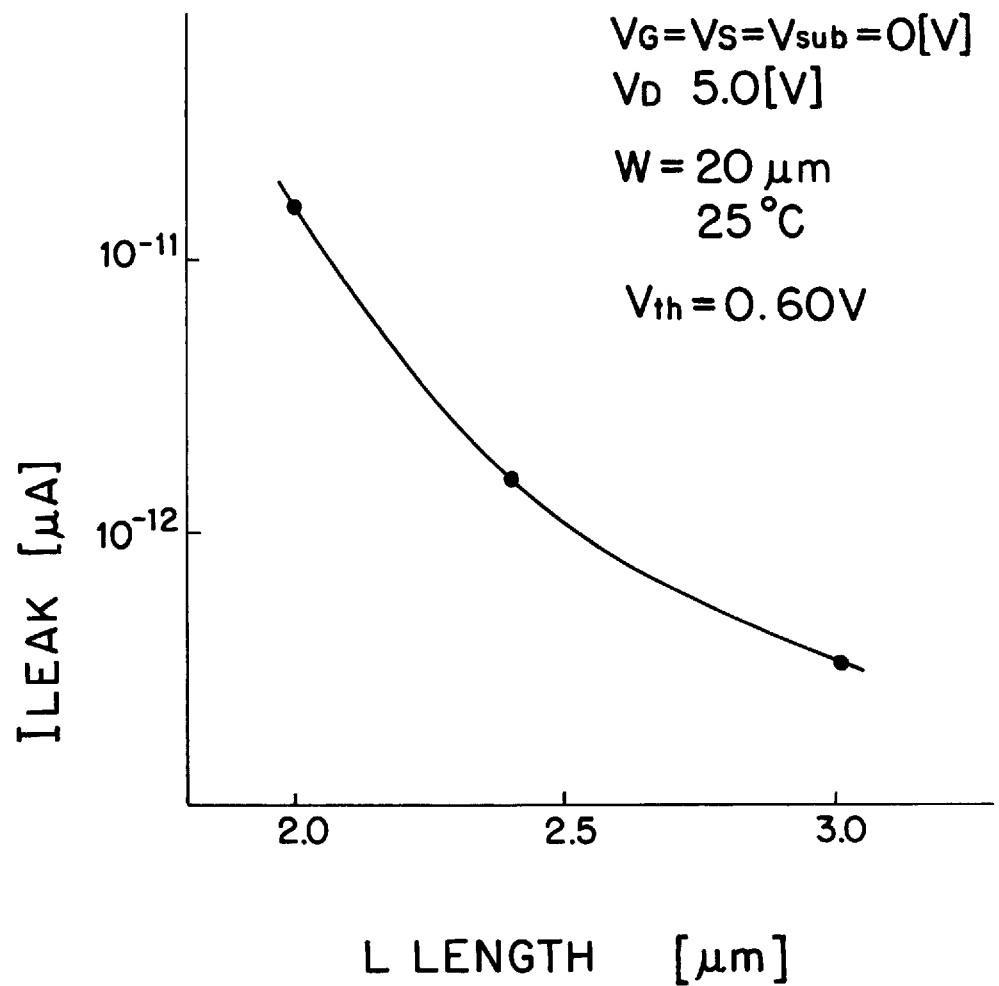
FIG. 5 is a graph showing a relation between the off-leak current and the channel length (L length) of a MOS transistor.
Figure 6C:
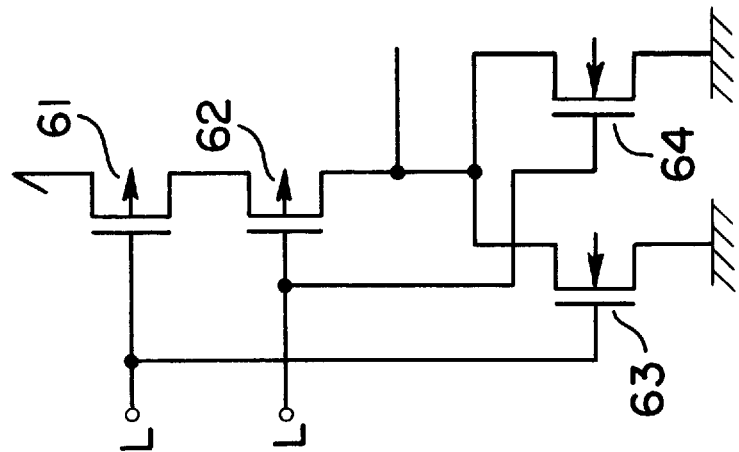
FIG. 6A–6C are circuit diagrams of a NOR gate circuit showing three different input voltage patterns.
Figure 6B:
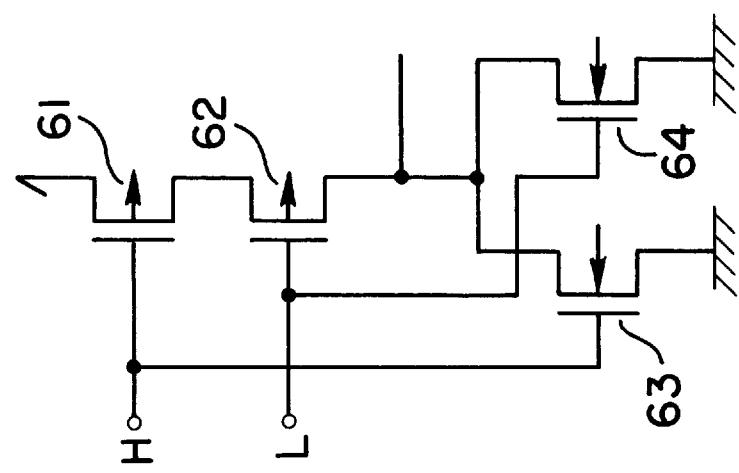
Figure 6A:
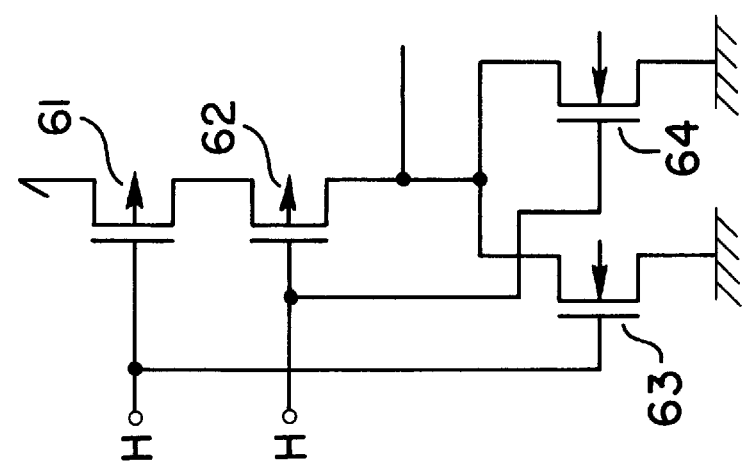

Then, this influence is alleviated by increasing the L length of the devises where Vth is lowered more than the L length of the circuit having the conventional Vth. FIG. 5 shows a L length dependency of the off-leak current. The leak current can be largely suppressed by prolonging the L length. In FIG. 2, the L length of the PMOS transistor and the NMOS transistor is increased. When the semiconductor chip is in the stand-by state and the potential of the node terminal of each transistor is inevitably determined, either of the L length may be increased. In other words, in the case where the input is determined to a High potential, the PMOS transistor becomes an off-leak path. Thus, this L length is increased, and the NMOS transistor may be of the conventional size. In the meantime, when the input is a Low potential, only the L length of the NMOS transistor may be increased. This method holds true of the NOR gate and NAND gate which have multiple input gates. FIGS. 6A, 6B and 6C are views in which three patterns of inputs are given to 2 NOR gate circuit.

In FIG. 6A, when the L length of either PMOS transistors 61 or 62 is increased, the off-leak current is eliminated. In FIG. 6B, only the L length of the PMOS transistor 61 may be increased. In FIG. 6C, the path will cease to exist when both of the L length of the NMOS transistors 63 and 64 are increased.

Figure 7C:
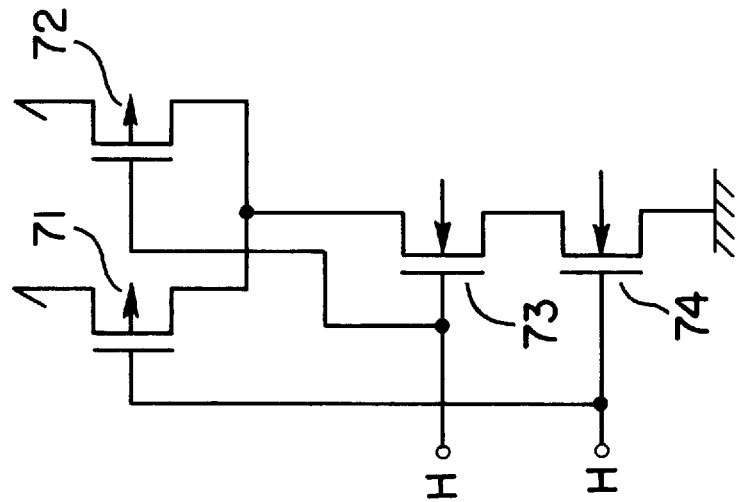
FIG. 7A–7C are circuit diagrams of a NAND gate circuit showing three different input voltage patterns.
Figure 7B:
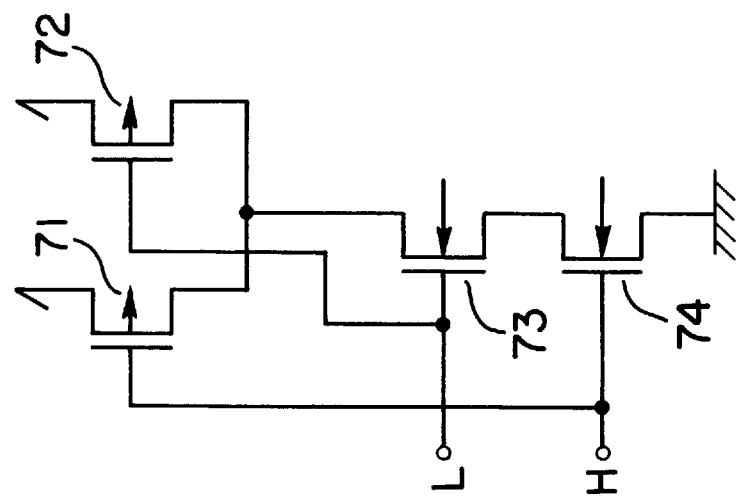
Figure 7A:
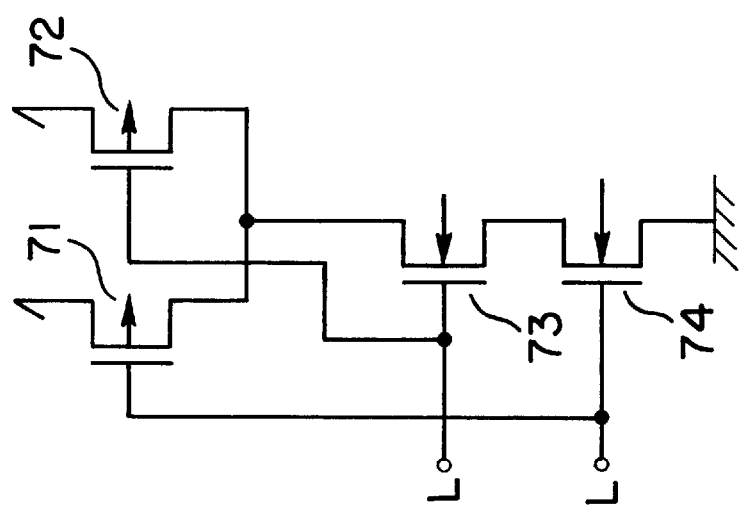

FIG. 7 shows a case of 2 NAND gates. When each node potential is determined at the time of the stand-by state as shown in FIGS. 7A, 7B and 7C, either of the NMOS transistors 73 and 74 is determined at the time shown in FIG. 7A. The NMOS transistor 73 is determined at the time shown in FIG. 7B. The L length of both PMOS and PMOS transistors 71 and 72 may be increased at the time shown in FIG. 7C. The same thing holds true of the circuit of three or more inputs.

Up to this point, the explanation is given on the assumption that the Vth dependency of the off-leak current is conspicuous in both the PMOS transistor and the NMOS transistor. In the case where the PMOS transistor is largely conspicuous and the NMOS is not so conspicuous, the L length of the NMOS need not be increased. Only the L length of the PMOS transistor may be increased. On the contrary, when only the off-leak current of the NMOS transistor is conspicuous, only the L length of the NMOS transistor may be increased.

The prolongation of the L length for the prevention of the off-leak current is not required with respect to all the transistors. Only the channel length of the NMOS transistor is required to be lengthened which has a low threshold voltage for the channel in which the off-leak current is generated which affects the stand-by current. An increase in the area of the circuit can be minimized by selectively prolonging the L length in this manner.

Next, a circuit will be considered whose threshold voltage Vth needs to be lowered. With respect to all the circuits which are operated at a first power source voltage range (for example, 0.9 V to 5.5 V) including the extremely low power source voltage (0.9 V), the threshold voltage Vth needs to be lowered. However, the circuit which is operated in this voltage range in the product specification and the circuit which is operated in a second power source voltage range (for example, 1.8 to 5.5 V) where the minimum operation voltage is higher than the minimum voltage in the first range of power source voltages are formed on the same semiconductor substrate. Thus threshold voltage Vth of the MOS transistor only operating in the first range needs to be lowered. The threshold Vth of the circuit which is operated in the second range of power source voltages need not be lowered. Then the circuit whose threshold voltage Vth is not lowered is not affected by the off-leak current so the L length need not be prolonged. Only the L length of the portion where the threshold voltage Vth is lowered may be increased. This enables a reduction in area and consumption current.

Figure 8:
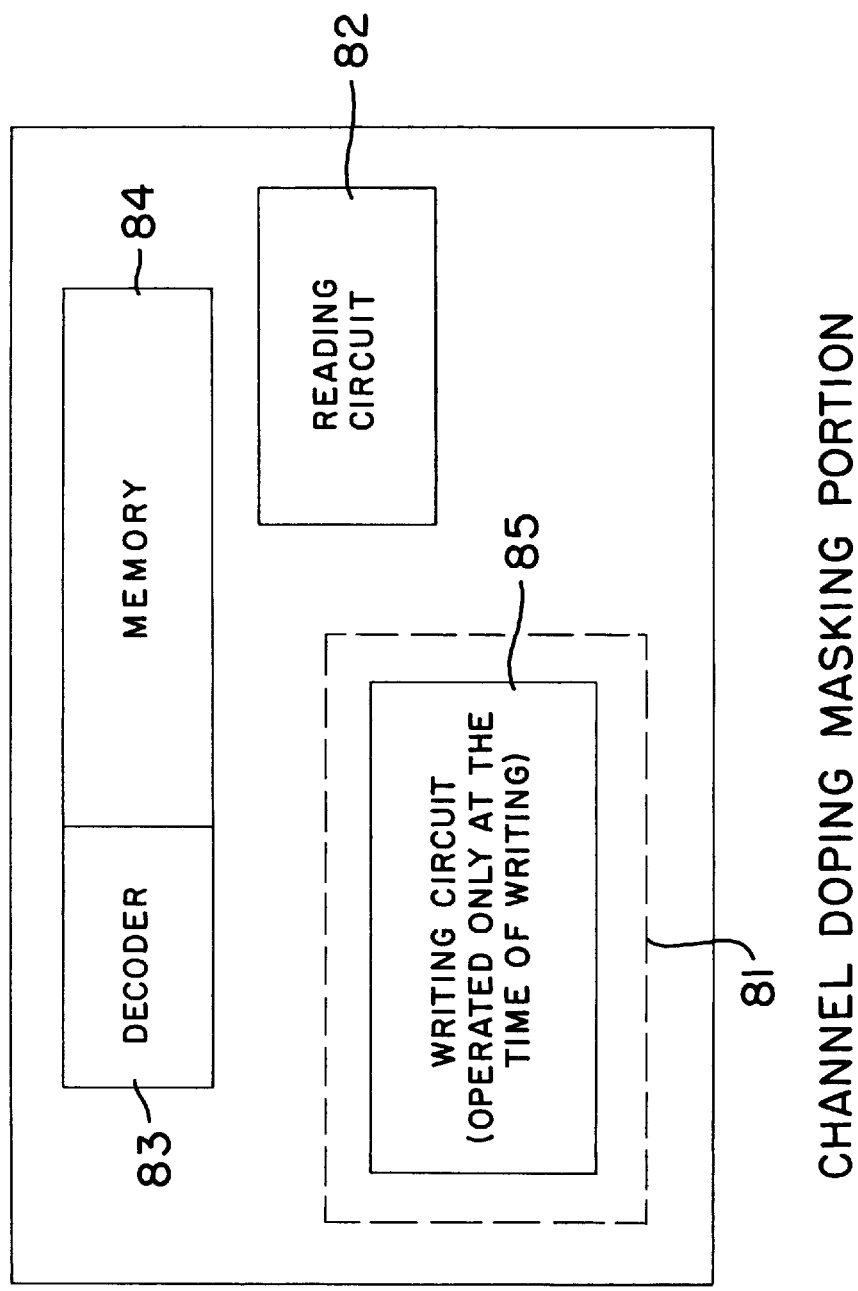
FIG. 8 is a schematic view of an EEPROM semiconductor chip of the present invention.
Figure 9:
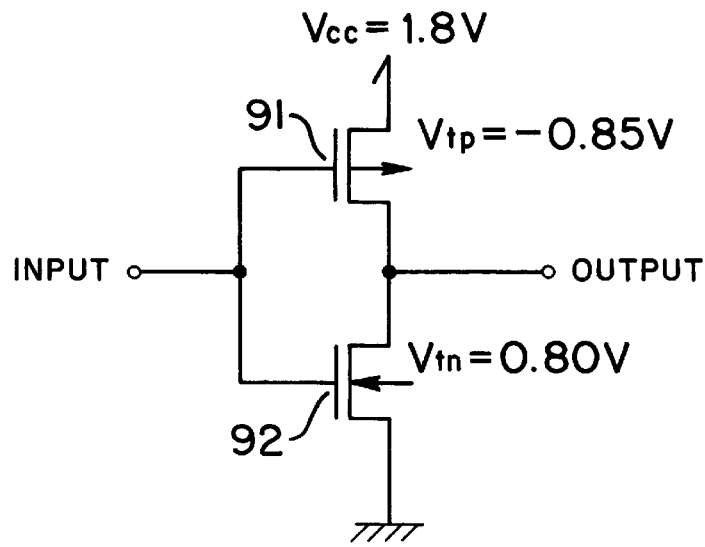
FIG. 9 is a circuit diagram of the CMOS inverter in a conventional semiconductor integrated circuit device.
Figure 10:
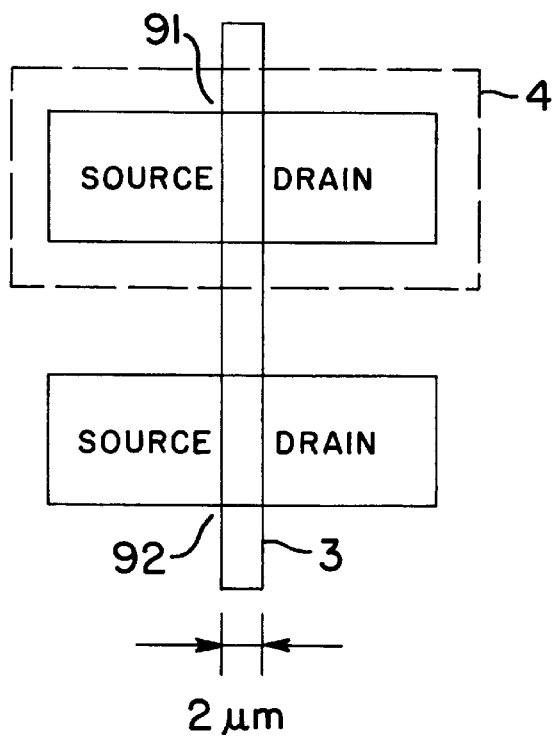
FIG. 10 is a plane pattern view of the CMOS inverter in the conventional semiconductor integrated device.

FIG. 8 is a schematic view of an EEPROM semiconductor chip. In the semiconductor chip, a memory 84, the decoder 83, and a reading circuit 82 are formed for operating the memory 84 and the writing circuit 85. In the case where this whole circuit must be operated at 0.9 V, the threshold Voltage Vth of the whole circuit must be lowered. However, the EEPROM is roughly divided into two circuit areas for performing two distinct operations; a reading circuit for performing a reading operation (read) and a writing circuit for performing writing operation (write). In the case where respective minimum operation voltage specification is 0.9 V, 1.8 V or the like, only the threshold voltage Vth of the circuit which is operated at the time of a reading operation may be lowered. When the threshold voltage Vth of the circuit which is operated at the writing operation (for example, a charge pump, a ring oscillator or the like) is lowered, the consumption current at the time of the operation of the ring oscillator is largely increased thereby damaging the characteristics of the circuit.

The threshold voltage Vth is controlled by the channel doping step to the channel portion of the MOS transistor. However, the threshold voltage can be selectively changed by masking a portion where the threshold voltage Vth is not required to be lowered and by the implantation of the portion where the threshold voltage is required to be lowered. As shown in FIG. 8, the writing circuit 85 which is operated at the time of the writing operation and which is not operated at the time of the reading operation is masked by mask 81, and the threshold voltage Vth is realized by the channel dope implantation.

In other words, this means that the semiconductor chip (the L length of the required portion is lengthened) having the specification of 1.8 V read and the 1.8 V write can be modified into a product with a specification of 0.9 V read and 0.9 V write by simply adding a process of the channel dope implantation.

In this manner, the threshold voltage Vth is selectively lowered, and only the L length of the required portion is lengthened so that a semiconductor chip corresponding to each voltage can be prepared, and a reduction in the area and the elimination of consumption current can be made possible.

Figure 11:
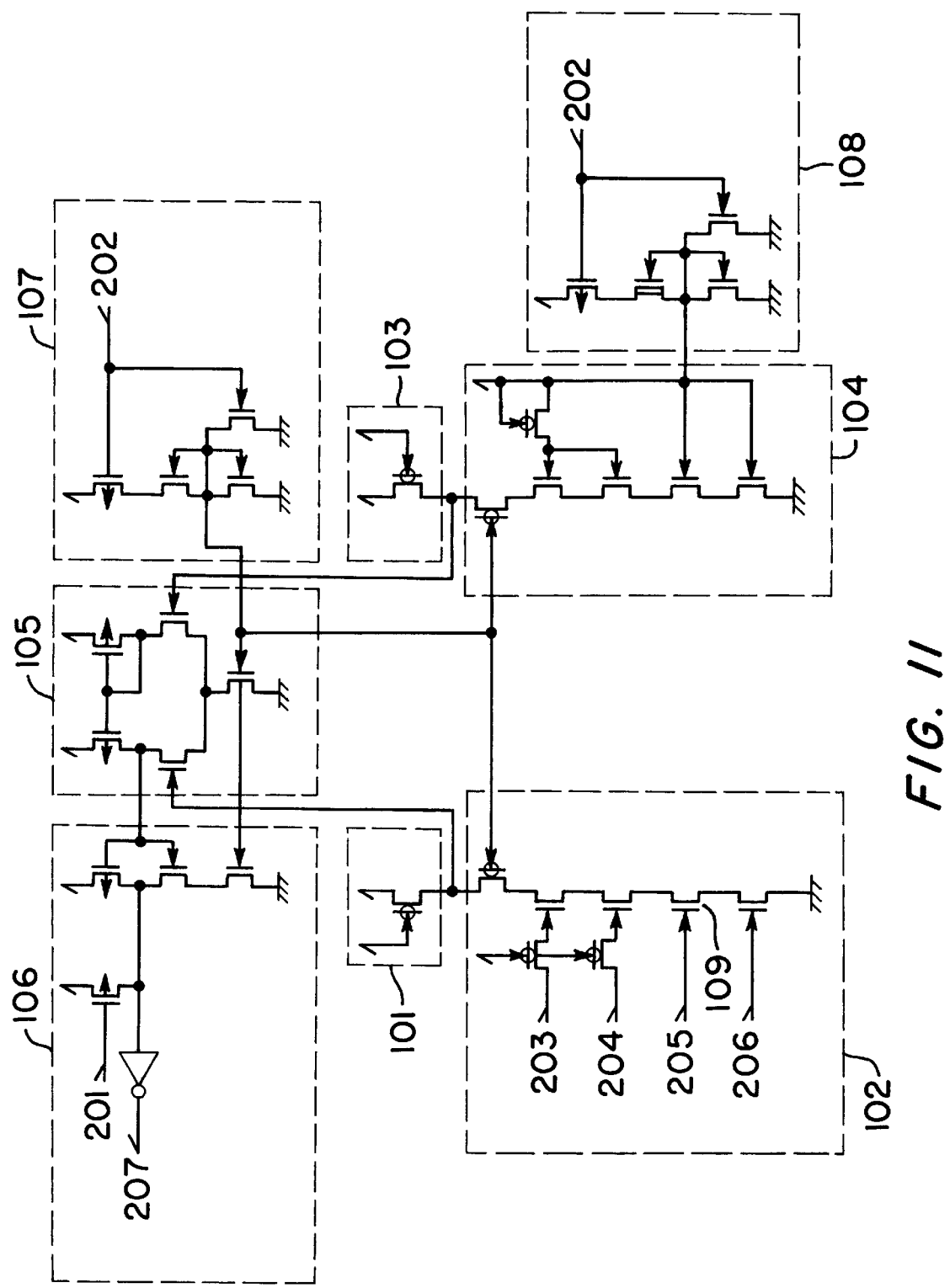
FIG. 11 is a circuit diagram of a sense amplifier according to a first embodiment of the present invention.

FIG. 11 is a circuit diagram of a sense amplifier circuit according to one embodiment of the present invention. To the pair of input terminals of the differential amplifier circuits 105, precharge circuits 101 and 103 and the load circuits 102 and 104 are connected. The output of the differential amplifying circuit 105 is connected to the input of the buffer circuit 106. The precharge circuits 101 and 103 comprise N-type MOS transistors and the threshold voltage thereof is about 0.05 V.

Further, the output of the constant voltage circuit 107 is connected to the load circuits 102 and 104, the differential amplifying circuit 105 and the buffer circuit 106. The output of the constant voltage circuit 108 is input to the gate of a transistor of the load circuit 104 at a position corresponding to the memory element 109 of the load circuit 102 and is operated as a reference voltage. The load circuit 104 creates a reference current.

In the embodiment of the present invention, the circuit construction is symmetrical with respect to a pair of input terminals of the differential amplifying circuit so that the potential of the pair of input terminals changes in the same manner. Thus the circuit can be operated at a wide power source voltage range. Further, since the voltage drop portion with the NMOS transistor in precharge circuits 101 and 103 is approximately 0 V, the circuit can be operated at a low voltage.

Figure 12:
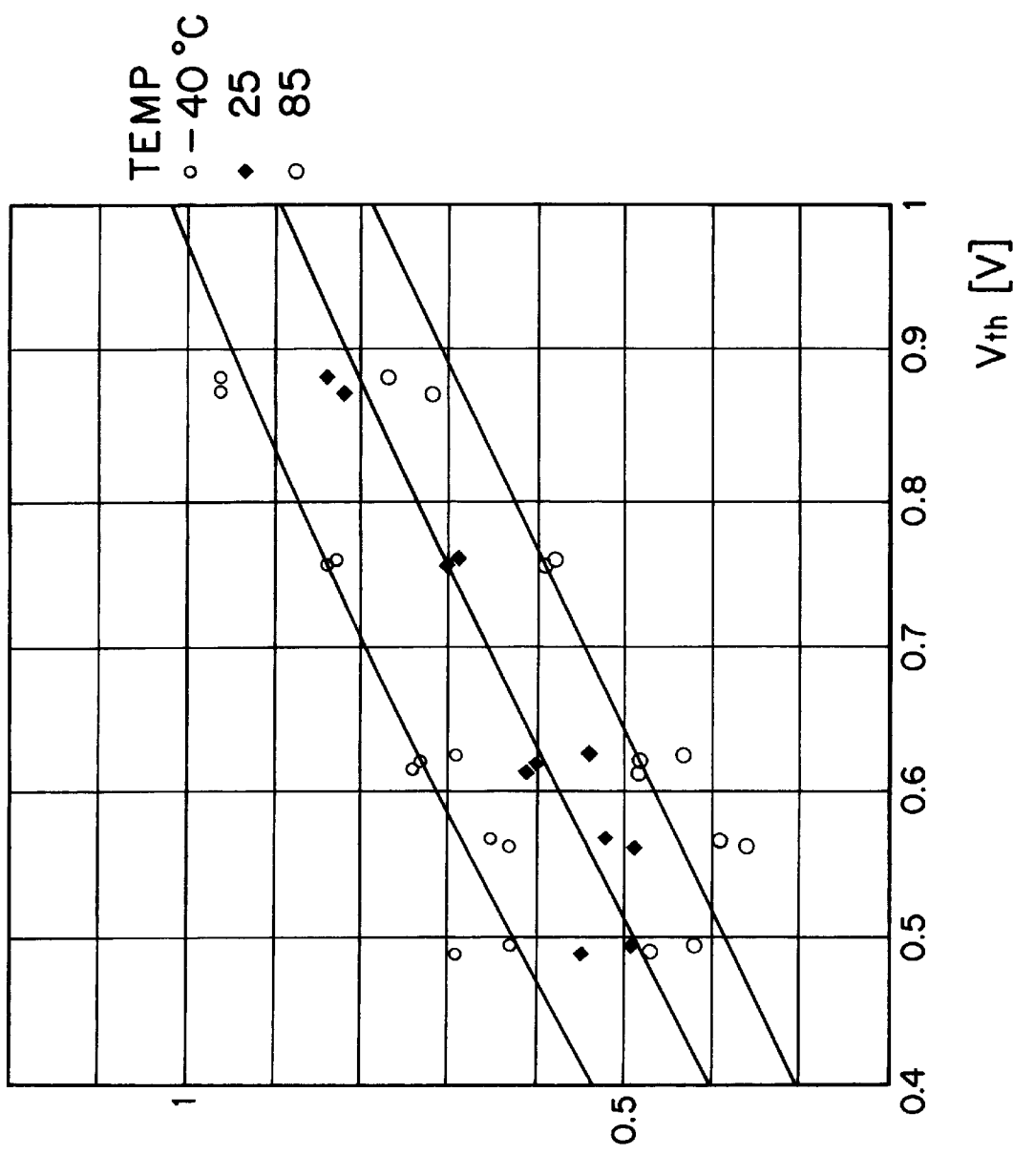
FIG. 12 is a graph showing a PMOS transistor threshold voltage dependency of a reading voltage of a semiconductor non-volatile memory device using the sense amplifier circuit of FIG. 11.

FIG. 12 shows the data reading characteristics of the non-volatile memory device using the embodiment shown in FIG. 11 wherein the relations between the minimum voltage Vcc Min. (read) (vertical axis) for data reading and the threshold voltage Vtp (horizontal axis) of the input transistor of the differential amplifying circuit 105.

Figure 13:
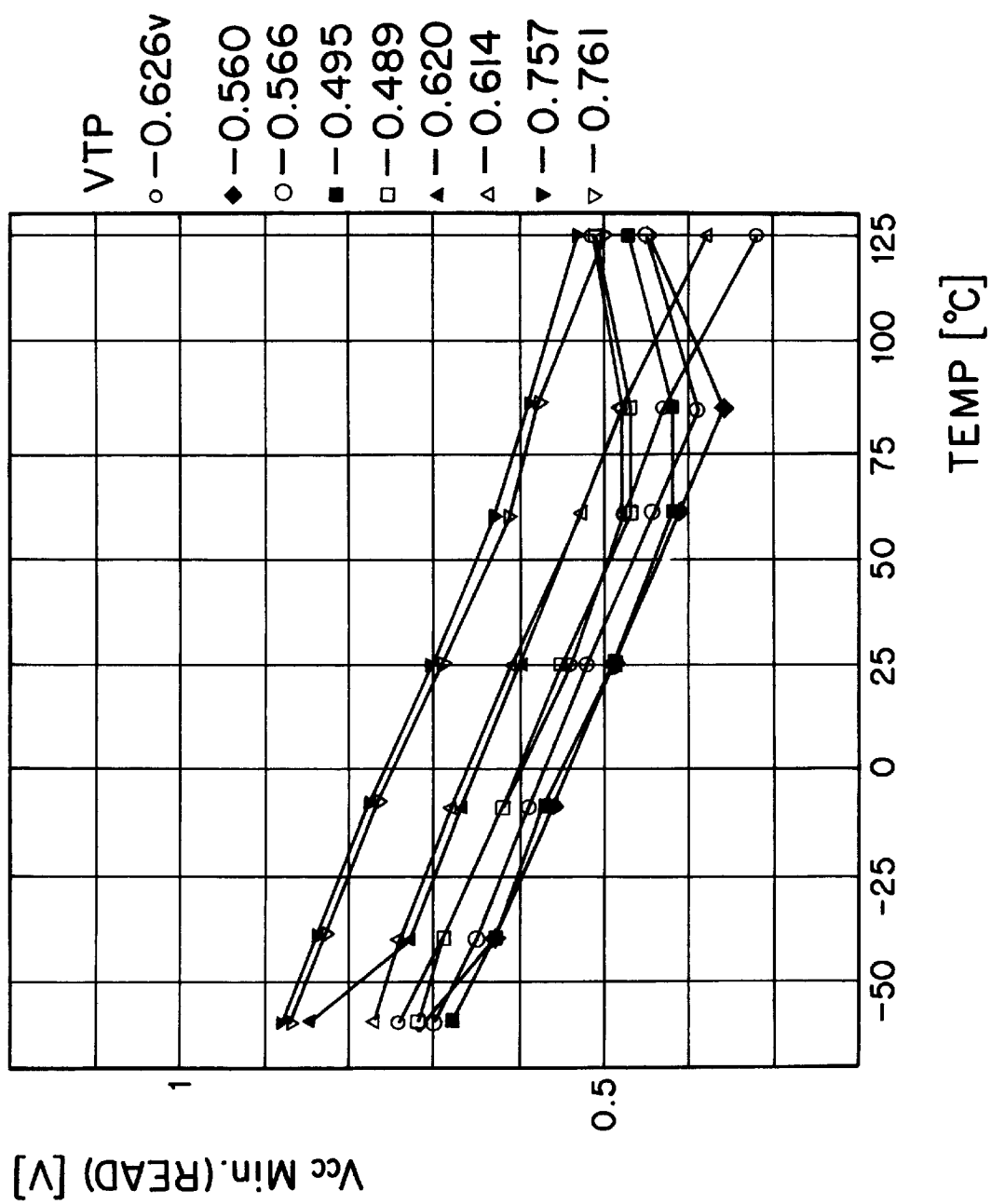
FIG. 13 is a graph showing temperature characteristics of a reading voltage of the semiconductor non-volatile memory device using the sense amplifier circuit of FIG. 11.

FIG. 13 verifies that the Vcc of 0.9 V or less can be realized when the Vtp is 0.7 V or less to 0.9 V or less in the normal use temperature range with respect to the temperature characteristics of the above device. Further, data read with Vcc 0.9 V or less is fully realized when the Vtp is 0.7 V or less.

Figure 14:
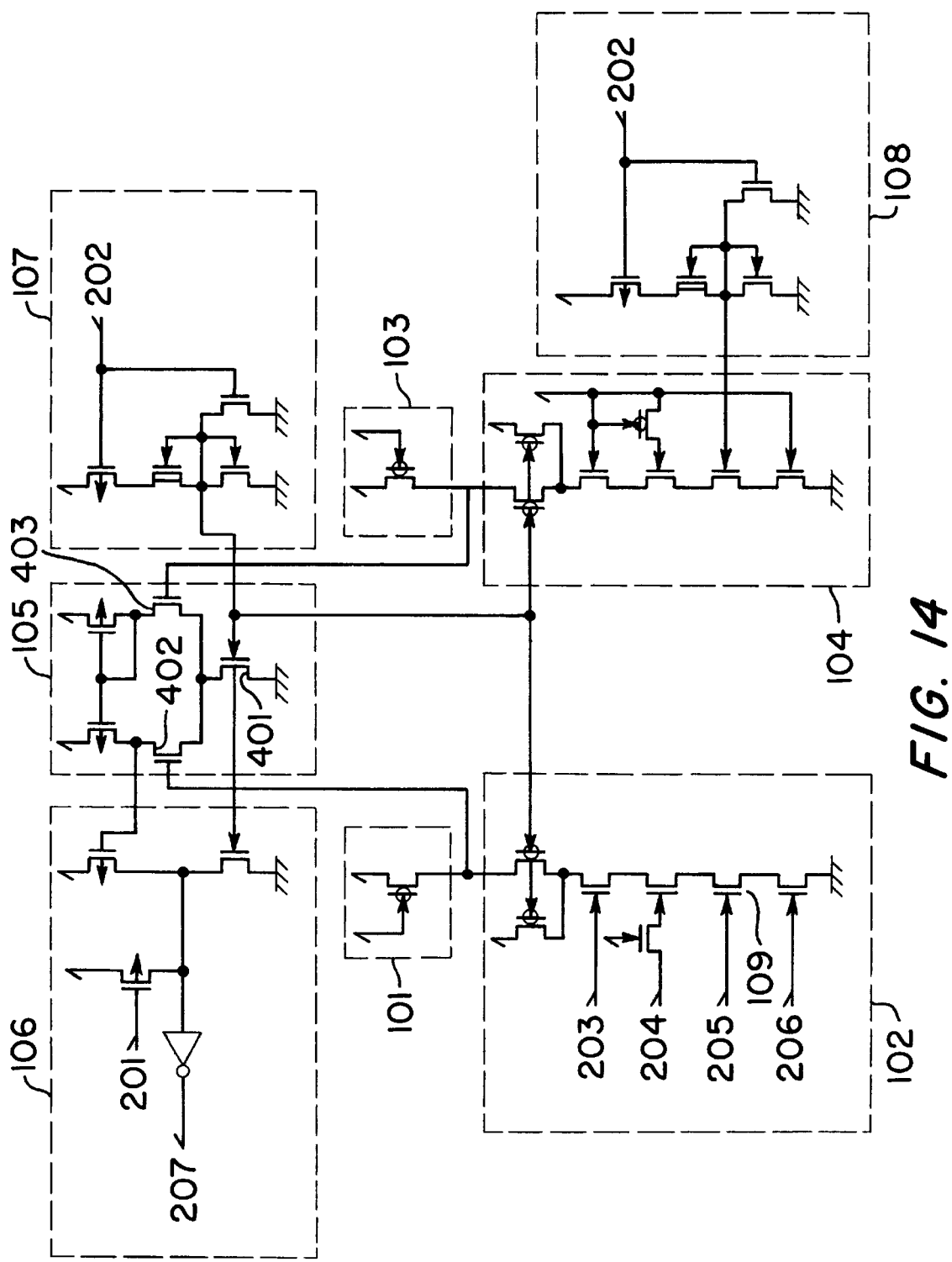
FIG. 14 is a sense amplifier circuit diagram showing a second embodiment of the present invention.

FIG. 14 shows a sense amplifier circuit diagram according to the second embodiment of the present invention. The basic structure of the sense amplifier circuit is as same as the embodiment of the present invention shown in FIG. 11.

The N-type MOS transistor of the differential amplifying circuit 105 uses two different kinds of gate insulating films. The thickness of the gate insulating film of the transistor 401 is 600 Å. The transistor is of the same kind as the transistor constituting a constant voltage circuit 107 so that the control of current is further improved.

The transistors 402 and 403 constitute a current mirror circuit. The gate insulating film has a thickness of 350 Å. Here, the speed of the sense amplifier circuit is improved by enlarging the current driving capacity of the transistor.

Figure 15:
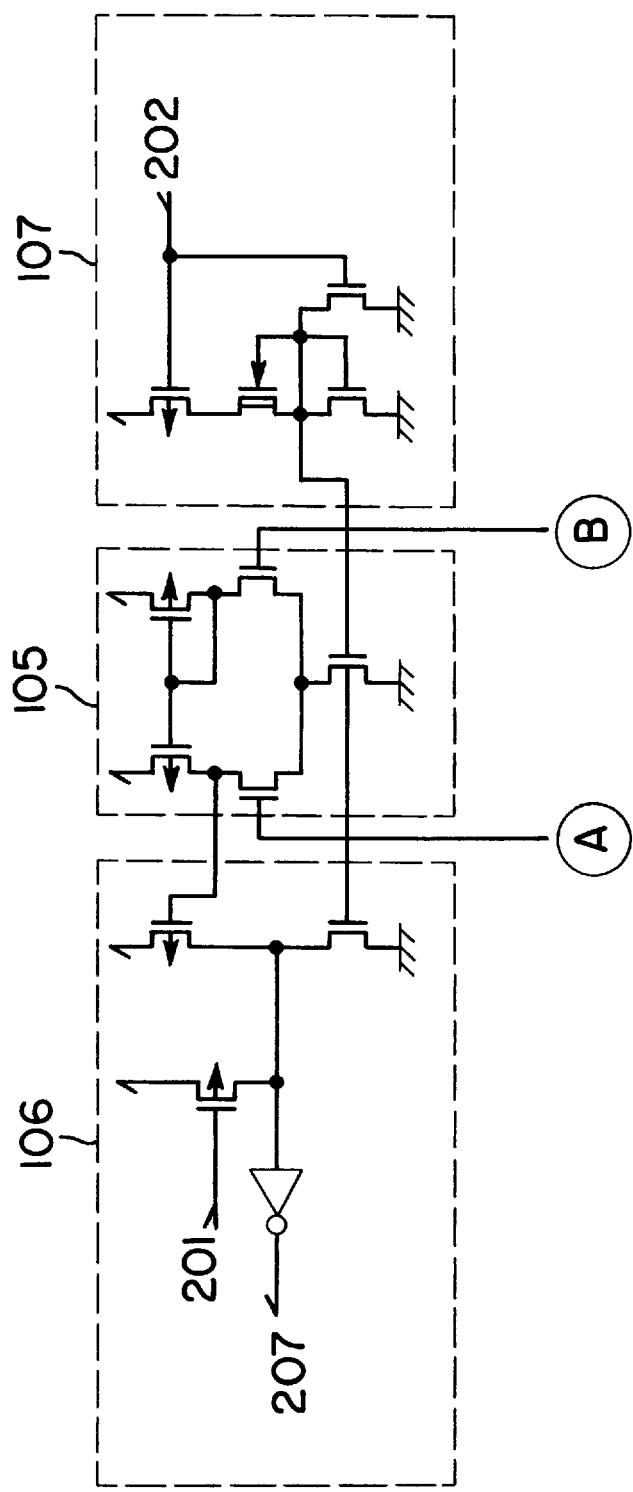
FIG. 15 is a circuit diagram of a differential amplifying circuit, a buffer circuit, and a constant voltage circuit in a sense amplifier circuit according to a third embodiment of the present invention.
Figures 16A, 16B:
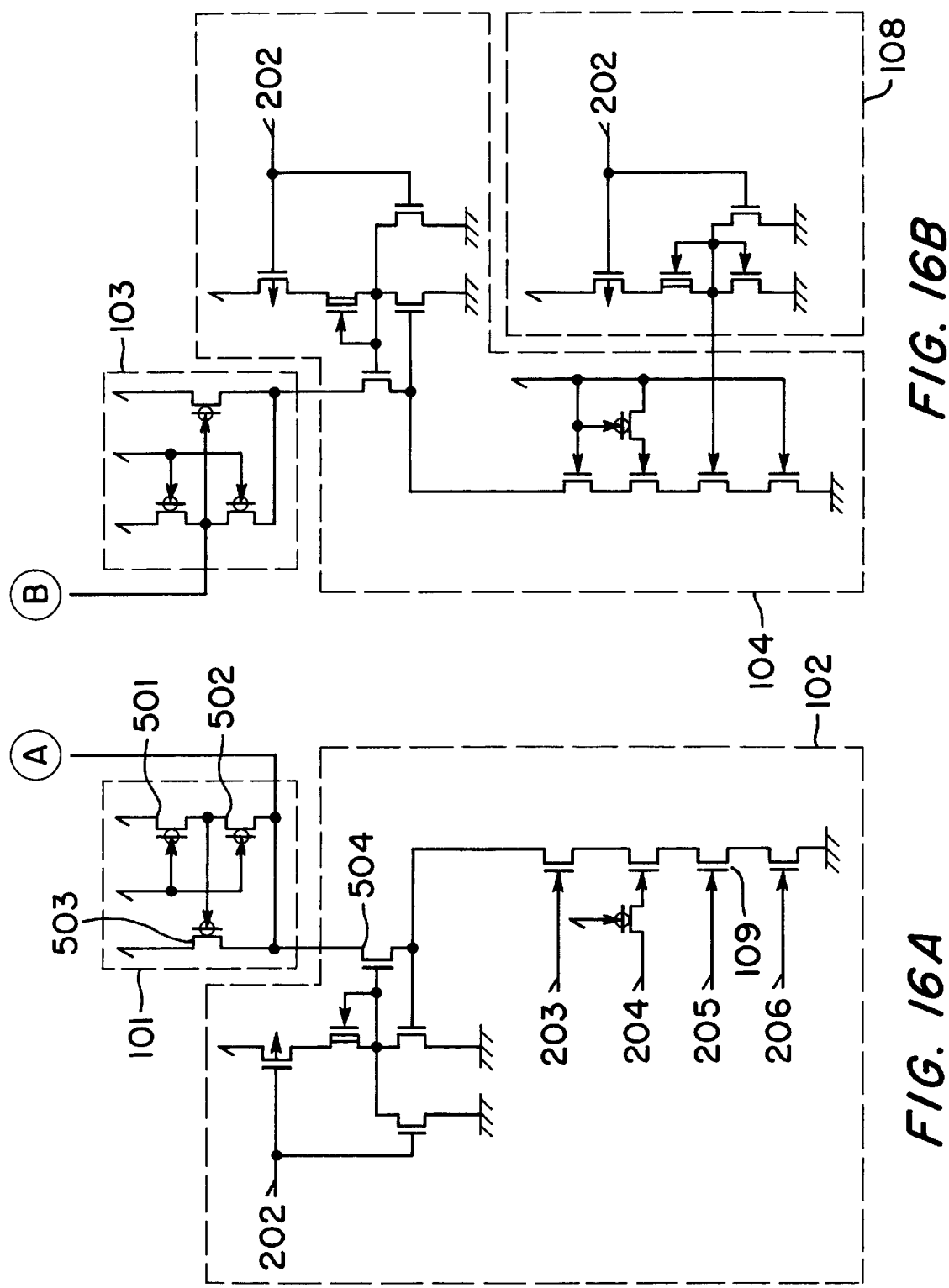
FIG. 16A and 16B are a circuit diagram of a precharge circuit, a load circuit, and a constant voltage circuit in a sense amplifier circuit according to the third embodiment of the present invention.
Figure 17:
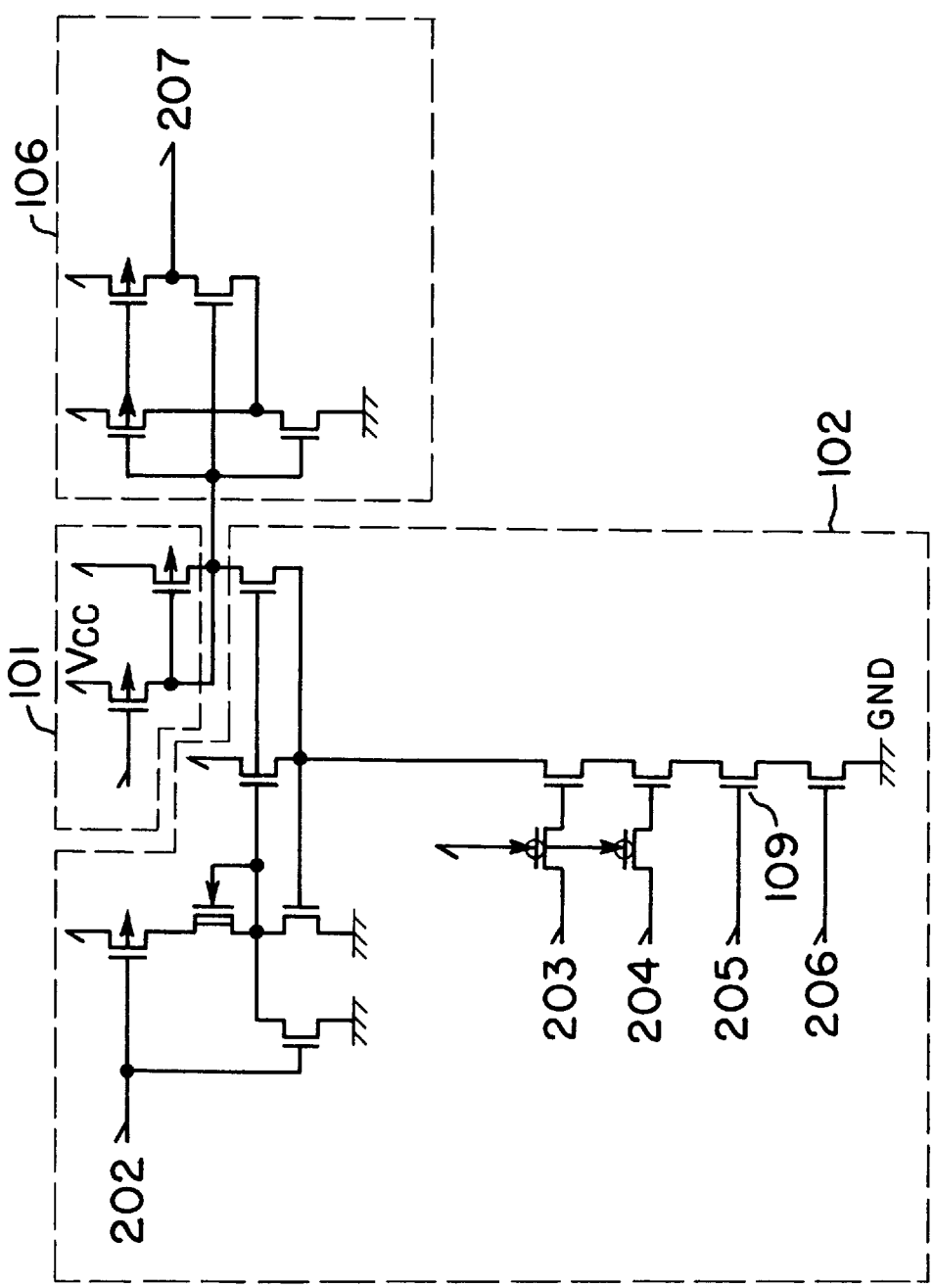
FIG. 17 is a sense amplifier circuit diagram according to the prior art.
Figure 18:
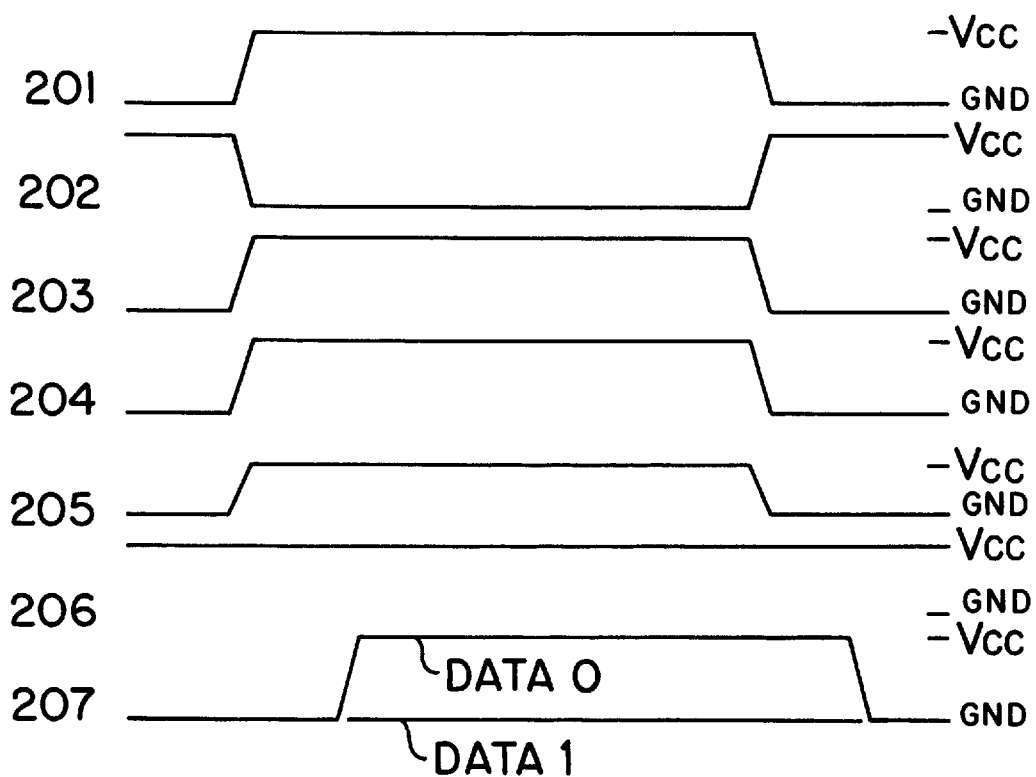
FIG. 18 is a timing diagram showing each signal level at the time of the operation of a sense amplifier circuit shown in FIGS. 11, 14, 15, 16 and 17.

FIGS. 15 and 16 show sense amplifier circuit diagrams according to a third embodiment of the present invention.

The basic structure of the sense amplifier circuit is as same as the embodiment of the present invention shown in FIG. 11.

The precharge circuit 101 comprises transistors 501 and 502 connected in series and a transistor 503 which is connected in parallel to the transistors 501 and 502 so that the precharge circuit 101 can corresponds to the an increase in the current flowing through the load circuit 102. The precharge circuit 103 has the same structure as the precharge circuit 101. However, the output take-out position is changed to vary the input voltage to the differential amplifying circuit 105.

In the load circuit 102, the transfer gate 504 comprises a feedback circuit so that when current flows through the memory element 109, the transfer gate 504 will cause current to flow. In the meantime, when current does not flow through the memory circuit the transfer gate 504 will inhibit the flow of the current. With such a structure, the speed of the sense amplifier circuit can be heightened.

As described above, the present invention enables the operation of a semiconductor integrated circuit device at an extremely low power source voltage (0.9 V) while maintaining the conventional low stand-by current characteristics.

In addition, in the present invention a high voltage specification can easily be changed to a low voltage specification only with the addition of the step of masking the channel dope, which has the effect of a reduction in the area and a reduction in the consumption current.

What is claimed is:

1. In an EEPROM comprising a semiconductor substrate, a decoder circuit formed on the semiconductor substrate for decoding input signals, a memory array formed on the semiconductor substrate for storing the decoded signals, a reading circuit formed on the semiconductor substrate for operating the decoder circuit and the memory array, and for reading out data stored in the memory array, and a writing circuit formed on the semiconductor substrate for operating the decoder circuit and the memory array, and for writing data to the memory array, the improvement comprising: a circuit layout wherein the EEPROM is divided into a first circuit area comprising a plurality of first transistors driven by a first range of power source voltage, an absolute value of a threshold voltage of the first transistors in the first circuit area being within the range of approximately 0.3 V to 0.7 V, the first circuit area including at least the reading circuit, and a second circuit area comprising a plurality of second transistors driven by a second range of power source voltage, an absolute value of a threshold voltage of the second transistors in the second circuit area being within the range of approximately 0.7 V to 0.9 V, the second circuit area including at least the writing circuit.

2. An EEPROM according to claim 1; wherein the first range of power source voltage is within the range of approximately 0.9 V and 5.5 V and the second power source voltage is within the range of approximately 1.8 V and 5.5 V.

3. An EEPROM according to either of claims 1 or 2; wherein the memory array includes a non-volatile memory circuit.

4. An EEPROM according to either of claims 1 or 2; wherein the reading circuit comprises a differential amplifying circuit having a pair of input terminals, a first precharge circuit and a first load circuit connected to one of the input terminals, and a second precharge circuit and a second load circuit connected to the other input terminal.

5. An EEPROM according to claim 4; wherein the first precharge circuit and the second precharge circuit each comprise one or more MOS transistors, and wherein a threshold voltage of the MOS transistors is approximately 0 V.

6. An EEPROM according to claim 1; wherein the second transistors have a channel length that is longer than a channel length of the first transistors.

7. An EEPROM according to claim 1; wherein a channel length of transistors among the first and second transistors in which an OFF-leak current is generated is longer than that of a channel length of the first and second transistors in which no OFF-leak current is generated.

8. An EEPROM according to claim 4; wherein the differential amplifying circuit comprises a current mirror circuit comprising a pair of transistors having a gate insulating film of a first thickness and a third transistor having a gate insulating film of a second thickness.

9. In an EEPROM comprising a decoder circuit for decoding input signals, a memory array for storing data in accordance with the decoded signals, a reading circuit connected to the decoding circuit and the memory array for reading out data stored in the memory array in accordance with an input signal, and a writing circuit connected to the decoder circuit and the memory array for writing data to the memory array in accordance with an input signal, the improvement comprising: a circuit layout wherein the EEPROM is divided into a first circuit area comprising a plurality of first transistors driven by a first range of power source voltage, an absolute value of a threshold voltage of the first transistors being within a first range of voltages, the first circuit area including at least the reading circuit, and a second circuit area comprising a plurality of second transistors driven by a second range of power source voltage, an absolute value of a threshold voltage of the second transistors being within a second range of voltages higher than the first range of voltages, the first circuit area including at least the reading circuit, the second circuit area including at least the writing circuit, such that the EEPROM may be driven by an extremely low voltage for reading data stored therein.

10. An EEPROM according to claim 9; wherein the first range of voltages is within the range of approximately 0.3 V to 0.7 V and the second range of voltages is within the range of approximately 0.7 V to 0.9 V.

11. An EEPROM according to claim 9; wherein the first range of power source voltage is within the range of approximately 0.9 V to 5.5 V and the second range of power source voltage is within the range of approximately 1.8 V to 5.5 V.

12. An EEPROM according to claim 9; wherein the memory array includes a non-volatile memory circuit.

13. An EEPROM according to claim 9; wherein the reading circuit comprises a differential amplifying circuit having a pair of input terminals, a first precharge circuit and a first load circuit connected to one of the input terminals, and a second precharge circuit and a second load circuit connected to the other input terminal.

14. An EEPROM according to claim 13; wherein the first precharge circuit and the second precharge circuit each comprise one or more MOS transistors, and wherein a threshold voltage of the MOS transistors is approximately 0 V.

15. In an EEPROM circuit comprising a decoder circuit for decoding input signals, a memory array for storing data in accordance with the decoded signals, a reading circuit for reading out data stored in the memory array in accordance with an input signal, a writing circuit for writing data to the memory array in accordance with an input signal, and a sense amplifier circuit comprising a differential amplifying circuit having a pair of input terminals, a first precharge circuit and a first load circuit connected to one of the input terminals, and a second precharge circuit and a second load circuit connected to the other input terminal, the improvement comprising: a circuit layout wherein the EEPROM is divided into a first circuit area comprising a plurality of first transistors driven by a first power source voltage, an absolute value of a threshold voltage of the first transistors being within a first range of voltages, the first circuit area including at least the sense amplifier, and a second circuit area comprising a plurality of second transistors driven by a second power source voltage, an absolute value of a threshold voltage of the second transistors being within a second range of voltages higher than the first range of voltage, the second circuit area including at least the writing circuit, such that the EEPROM may be driven by an extremely low voltage for reading data stored therein.

16. An EEPROM according to claim 15; wherein the first range of voltages is within the range of approximately 0.3 V to 0.7 V and the second range of voltages is within the range of approximately 0.7 V to 0.9 V.

17. An EEPROM according to claim 15; wherein the first power source voltage is within the range of approximately 0.9 V to 5.5 V and the second power source voltage is within the range of approximately 1.8 V to 5.5 V.

18. An EEPROM according to claim 15; wherein the memory array includes a non-volatile memory circuit.

19. An EEPROM according to claim 15; wherein the first precharge circuit and the second precharge circuit each comprise one or more MOS transistors, and wherein a threshold voltage of the MOS transistors is approximately 0 V.

* * * * *